United States Patent [19]
Beuhler et al.

[11] Patent Number: 5,268,193
[45] Date of Patent: Dec. 7, 1993

[54] LOW DIELECTRIC CONSTANT, LOW MOISTURE UPTAKE POLYIMIDES AND COPOLYIMIDES FOR INTERLEVEL DIELECTRICS AND SUBSTRATE COATINGS

[75] Inventors: Allyson J. Beuhler, Indian Head Park; Neal R. Nowicki, St. Charles; Douglas E. Fjare, Naperville, all of Ill.

[73] Assignee: Amoco Corporation, Chicago, Ill.

[21] Appl. No.: 947,380

[22] Filed: Sep. 18, 1992

Related U.S. Application Data

[60] Division of Ser. No. 436,301, Nov. 13, 1989, Pat. No. 5,206,091, which is a continuation-in-part of Ser. No. 212,511, Jun. 28, 1988, abandoned.

[51] Int. Cl.$^5$ ................................. B05D 5/12
[52] U.S. Cl. ................................. 427/96; 427/388.1
[58] Field of Search ................................. 427/96, 388.1

[56] References Cited

U.S. PATENT DOCUMENTS

| | | | |
|---|---|---|---|
| 3,179,614 | 4/1965 | Edwards | 260/30.2 |
| 3,179,634 | 4/1965 | Edwards | 260/78 |
| 4,336,175 | 6/1982 | Gibbs | 524/726 |
| 4,528,004 | 7/1985 | Makino et al. | 427/385.5 |
| 4,681,928 | 7/1987 | Berger et al. | 528/353 |
| 4,720,539 | 1/1988 | Rabilloud et al. | 528/353 |
| 4,760,126 | 7/1988 | Numata et al. | 528/353 |
| 4,876,329 | 10/1989 | Chiang et al. | 528/353 |
| 4,877,653 | 10/1989 | Vora et al. | 427/385.5 |
| 4,927,736 | 5/1990 | Mueller et al. | 430/275 |
| 5,114,826 | 5/1992 | Kwong et al. | 430/192 |

FOREIGN PATENT DOCUMENTS 0251828  1/1988  European Pat. Off.
2188191  9/1987  United Kingdom.

*Primary Examiner*—Shrive Beck
*Assistant Examiner*—Erma Cameron
*Attorney, Agent, or Firm*—Rae K. Stuhlmacher; Wallace L. Oliver

[57] ABSTRACT

A group of polyimides and copolyimides made from 2,2-bis(3,4-dicarboxyphenyl)hexafluoropropane dianhydride (6FDA) or 2,2-bis(3,4-dicarboxyphenyl)propane dianhydride (IPAN) their acid or ester forms and selected aromatic diamines are disclosed which are useful for substrate coatings and interlevel dielectrics in on-chip and multi-chip package applications. In such applications these polymers exhibit lower dielectric constant, lower moisture uptake and reduced dielectric constant variation with temperature and humidity than existing polymers, yet they are both thermally stable at required processing temperatures and can form suitably adherent, pinhole-free coatings on electronic component substrates.

14 Claims, No Drawings

LOW DIELECTRIC CONSTANT, LOW MOISTURE UPTAKE POLYIMIDES AND COPOLYIMIDES FOR INTERLEVEL DIELECTRICS AND SUBSTRATE COATINGS

This is a divisional of application Ser. No. 436,301, filed Nov. 13, 1989, now U.S. Pat. No. 5,206,091, which is a continuation-in-part of Ser. No. 212,511, filed Jun. 28, 1988, abandoned.

BACKGROUND OF THE INVENTION

This invention relates to the use of low dielectric constant, low moisture uptake, thermally stable polyimides and copolyimides of 2,2-bis(3,4-dicarboxyphenyl)propane dianhydride (IPAN), 2,2-bis(3,4-dicarboxyphenyl)hexafluoropropane dianhydride (6FDA), or their esters or acids, and selected aromatic diamines as interlevel dielectrics and coatings for on-chip and multi-chip packages in electronic applications and, more particularly, to multilayer structures for electronics use wherein low dielectric constant, low moisture uptake, thermally stable, high Tg polymers are required for use as protective coatings on substrates and interlevel dielectrics sandwiched between two layers.

Aromatic polyimides have found extensive use in electronic packaging due to their high thermal stability, low dielectric constant and high electrical resistivity. Such polymers have been used as passivation coatings, interlevel dielectrics, die attach adhesives, flexible circuit substrates, and more recently as the interlevel dielectric in high speed IC interconnections. Although current polyimides have the thermal stability necessary to meet the rigorous processing conditions required in on-chip and multi-chip packaging use, they do not exhibit the low dielectric constant and reduced moisture uptake shown by lower thermal stability polymers such as polyethylene and polytetrafluoroethylene. However, where thermal stability requirements are demanding, the latter polymers, despite their excellent dielectric and moisture uptake properties, cannot be substituted for polyimides.

In addition to those requirements stated above, a polymer for such use in the electronics industry must be resistant to processing solvents, form pinhole-free coatings when spin-coated, adhere well to a variety of substrates such as silicon dioxide and silicon nitride, aluminum, other polyimides etc., contain less than 1 ppm ionic impurities, exhibit appreciable etch rates in plasma etch or reactive ion etch, and have high electrical resistivity. Because of the multiple and severe requirements, new polymers with improved properties (particularly the combination of low dielectric constant, low moisture uptake, and thermal stability) are commercially significant and in great demand.

Low moisture uptake and good thermal stability are required for polymeric coatings useful in microelectronics applications. The set of polymer physical properties which must be optimized for interlevel dielectric use includes the latter two properties plus low dielectric constant. A low dielectric constant is useful in polymeric microelectronic coatings too, but the value of the polymer dielectric constant is particularly important in the interlevel dielectric use.

The use of polyimides in industry, particularly in the coating art, is not new, and a number of publications exist trading their preparation and details of their uses. However, the definition of and optimization of the relevant polymer properties, particularly in the use of polyimides for microelectronics, still struggles with defining the polymer properties desired and relating the desired properties to the chemical and physical nature of the polyimide.

In U.S. Pat. No. 4,681,928 to M&T Chemicals, Inc., a vast number of polyimides, polyamides, etc., said to be useful generally for coatings are made from diamine and diacid compounds. Included in the list is the dianhydride, IPAN, and the diamine, 4,4'-[1,4-phenylene-bis(1-methylethylidene)]bisaniline (BAP). Very limited exemplification is made.

In U.S. Pat. No. 4,720,539 to Rabilloud et al., a number of polyimides for "insulating coatings and films and for enameling electric or magnetic wires" (see Column 1, lines 12-13) are disclosed, but the teaching does not describe the low dielectric constant, low moisture uptake, high Tg, thermally stable combination of properties which are believed important for the present electronics uses. The polymer made from 2,2-bis(4-aminophenyl)propane (BAA) and 6FDA is taught in Rabilloud et al. as an insulating coating but no mention is made of the interlevel dielectric use.

U.S. Pat. No. 4,528,004 to UBE is directed to a process for making an aromatic polyimide composites in the form of a porous membrane which is useful for gas separation. Although some of the polyimides are the same as those taught herein, the set of physical properties useful for gas permeable membranes is not the same set useful in coatings and interlevel dielectrics for electronics uses. Porous membranes and coatings are different uses of polyimides U.S. Pat. No. 4,760,126 to Hitachi teaches the use of polyimides for moisture resistant, heat resistant and solvent resistant coatings useful for electronic devices. Hitachi is silent on the low dielectric constant property desired here. In addition, the polyimides taught are different than those of Applicants and are made from complex acid dianhydrides having oxygen, ester or thioester linkages which insure that the Hitachi polyimides have higher dielectric constants than those of Applicants. The dianhydrides taught herein are different, being derivatives of the $>C(CH_3)_2$ or $>C(CF_3)_2$ group, which lead to chemically distinct polyimides having potentially lower dielectric constants. Although "co-use" of the two acid dianhydrides, IPAN and 6FDA, along with many others is mentioned at column 6, lines 11-12 of the '126 patent, the polyimides taught and claimed by '126, even with the "co-use," are not those here found valuable. Some of the present diamines are taught in the '126 patent, but none of the Hitachi polyimides are those used in this invention.

In U.S. Pat. No. 4,336,175 to Dupont, laminates made from 6-FTA (6FDA) and aromatic diamines including some of those disclosed herein are taught. The teaching is to an improved way of making the polyimides which are then combined with a filler to make the laminate. Coatings and interlevel dielectrics for electronics use are not taught, and the physical properties of the polyimides are thus not optimized for use as coatings and interlevel dielectrics.

In Polym. Prepn. 29 (1) 349-51 (1988) and a report from the 33rd International SAMPE Symposium, Mar. 7-10, 1988, a number of polyimides including one made from 6FDA and BAP were studied, and physical properties such as thermal stabilities as measured by TGA curves, dielectric constants, intrinsic viscosities (IVs), and solubilities are reported. The polymers are generally disclosed to be those with "improved dielectric behavior" and useful for "coating applications."

Polyimides useful for composites which are made from 6FDA and 4,4'-bis(p-aminophenoxy)biphenyl (APBP) are set forth in PCT Int. Appln. WO 86/4073 (1986) and in a paper by G. E. Chang and R. J. Jones, 28th Natl. SAMPE Symp., pp. 728-39 (1883). Polyimides and copolyimides made from APBP and either pyromellitic dianhydride or 3,3',4,4'-biphenyltetracarboxylic dianhydride are disclosed in a series of Japanese patents to Nitto Electric Ind., J.P. 61-143,433, 4 and 5, for use as electric insulating, heat- and wet-resistant polymers.

Now it has been found that improved polymers exhibiting most if not all of the above property requirements for microelectronic coatings and interlevel dielectrics can be found in aromatic polyimides by the careful selection of both the amine moiety and anhydride moiety used to make the polymers.

SUMMARY OF THE INVENTION

In one aspect, the invention is directed to a low dielectric constant, low moisture uptake, high Tg, thermally stable polyimide or copolyimide made from a compound selected from the group consisting of 2,2-bis(3,4-dicarboxyphenyl)propane dianhydride, 2,2-bis(3,4-dicarboxyphenyl)hexafluoropropane dianhydride, and their respective esters and acids, and an aromatic diamine selected from the group consisting of 3,5-diamino-t-butylbenzene, 3,5-diaminobenzotrifluoride, 4,4'-bis(p-aminophenoxy)biphenyl, 4,4'-bis(4-amino-2-trifluoromethylphenoxy)biphenyl, 2,2-bis[4-(p-aminophenoxy)phenyl]propane, 4,4'-[1,4-phenylene-bis(1-methylethylidene)]bisaniline, and 3',5-diamino-1,3,3,6'-tetramethyl-1-(4'-tolyl)indan in the form of a thin coating on a substrate.

In another aspect, the invention is directed to a low dielectric constant, low moisture uptake, high Tg, thermally stable polyimide or copolyimide made from a compound selected from the group consisting of 2,2-bis(3,4-dicarboxyphenyl)propane dianhydride, 2,2-bis(3,4-dicarboxyphenyl)hexafluoropropane dianhydride, and their respective esters and acids, and an aromatic diamine selected from the group consisting of 3,5-diamino-t-butyl-benzene, 3,5-diaminobenzotrifluoride, 4,4'-bis(p-aminophenoxy)biphenyl, 4,4-bis(4-amino-2-trifluoromethylphenoxy)biphenyl, 2,2-bis[4-(p-aminophenoxy)phenyl]propane, 2,2-bis(4-aminophenyl)propane, 2,2-bis[1,4-(p-aminophenoxy)phenyl]propane, 4,4'-[1,4-phenylene-bis(1-methylethylidene)]bisaniline, and 3'5-diamino-1,3,3,6'-tetramethyl-1-(4'-tolyl)indan in the form of an interlevel dielectric structure.

DETAILED DESCRIPTION OF THE INVENTION

The polyimides and copolyimides useful in this invention are those which have a low dielectric constant, preferably about 3 or less; low moisture uptake, preferably less than about 1% by weight at 100% relative humidity (R.H.); high Tg, preferably above about 300° C.; and high temperature of onset of degradation in nitrogen, preferably above about 450° C. The polyimides have been found to be useful in electronics applications for both coatings and interlevel dielectrics.

Polyimides for interlevel dielectrics are made from IPAN or 6FDA or their ester or acid forms, preferably the anhydride form, and an aromatic diamine. The diamine may be selected from the group consisting of 3,5-diamino-t-butylbenzene (DATB), 3,5-diaminobenzotrifluoride (DABF), 4,4'-bis(p-aminophenoxy)biphenyl (APBP), 2,2-bis(4-aminophenyl)propane (BAA), 2,2-bis(4-aminophenyl)hexafluoropropane (BAAF), 4,4'-bis(4-amino-2-trifluoromethylphenoxy)biphenyl (FAPB), m-phenylenediamine (MPDA), p-phenylenediamine (PPDA), 4,4'-diaminodiphenylether (OBA), 2,2-bis[4-(p-aminophenoxy)phenyl]propane (BAPP), 4,4'-[1,4-phenylene-bis(1-methylethylidene)]bisaniline (BAP), and 3',5-diamino-1,3,3,6'-tetramethyl-1-(4'-tolyl)indan (DATI). The structures of IPAN and 6FDA and the diamines together with their abbreviated designations are as follows:

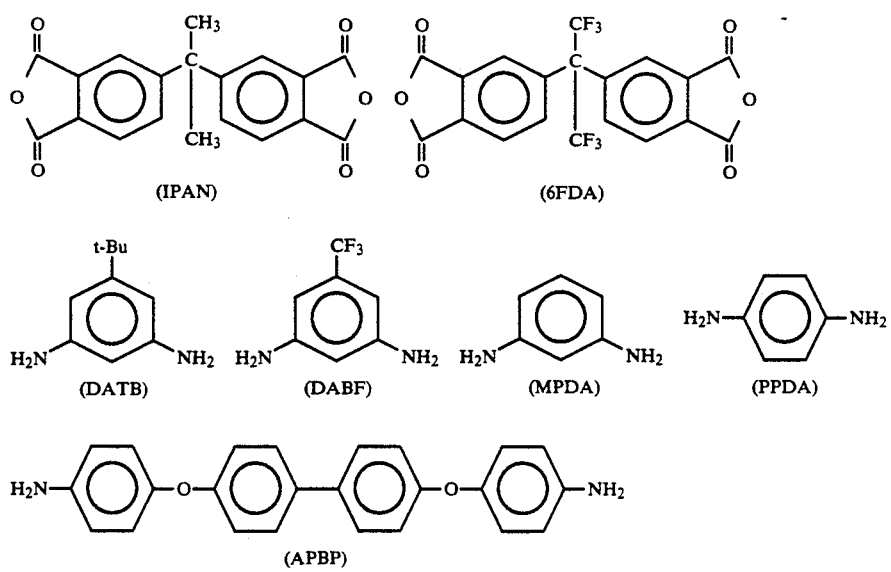

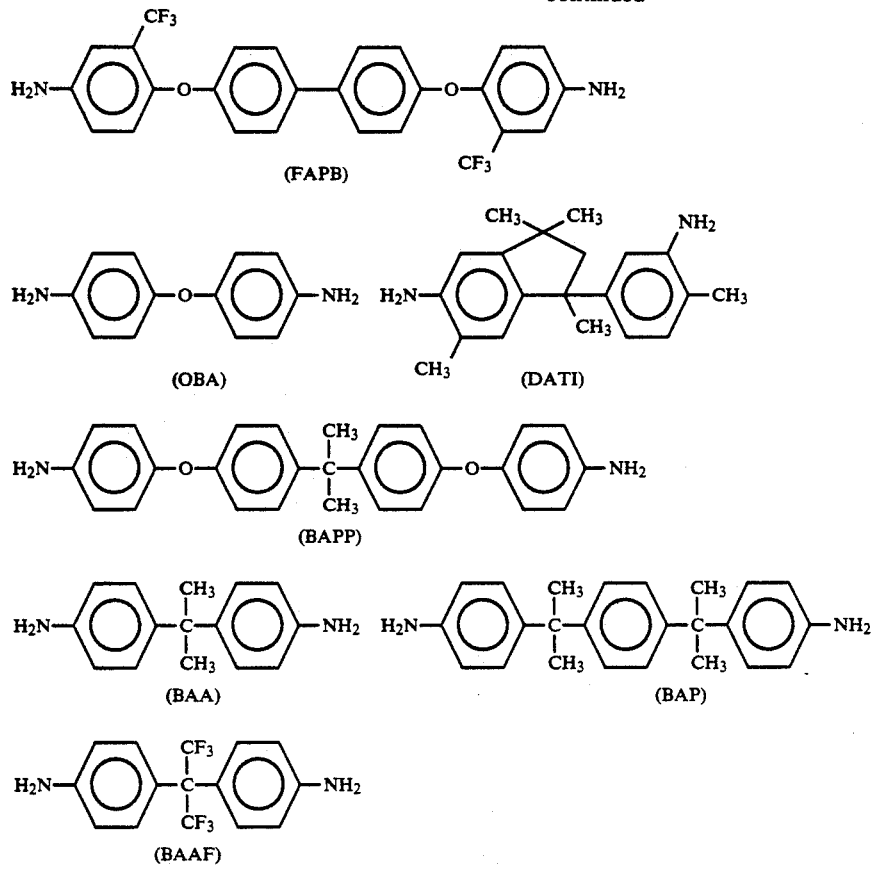

More preferably, the diamine for interlevel dielectrics may be selected from the group consisting of DATB, DABF, APBP, BAA, FAPB, BAAF, BAPP, BAP, and DATI. Still more preferably, the diamine is selected from APBP, FAPB, BAPP, and BAA, with BAA and APBP being most preferred.

Polyimides for coatings are also made from IPAN or 6FDA, or their ester or acid form, and a diamine. The diamine may be selected from the group consisting of APBP, DABF, DATB, FAPB, BAPP, and DATI, and more preferably from the group consisting of APBP, FAPB, and BAPP, and most preferably the diamine is APBP.

Mixtures of either IPAN or 6FDA and one or more of the diamines can be used to make the polyimide, or a copolyimide containing two or more different diamine moieties. More than one anhydride or the equivalent can also be used to make copolymers containing more than one anhydride moiety. The copolymers can contain any amount of another anhydride moiety or diamine moiety, preferably from 1% of the one component and 99% of the second component to 99% of the first component and 1% of second component.

Generally, a polymer grade aromatic diamine of the invention is dissolved in a solvent such as N-methylpyrrolidone or dimethyl acetamide, and the anhydride or its equivalent dissolved in the solution of diamine at room temperature up to about 100° C. to make a solution of the polyamic acid. Desirably, solutions of the polyamic acid from about 5 to about 75 wt. percent, more preferably from about 5 to about 50 wt. percent, are employed. In general, roughly equimolar components of the amine and anhydride are used in making up the solution although the molecular weight of the polymer can be controlled by adding an excess of one or the other components. A monofunctional amine or anhydride can also be employed to control molecular weight.

The resulting solution of polyamic acid can be spread on a substrate, and the solvent evaporated to fully imidize the polyamic acid and make the layer or coating. The coating or dielectric interlayer is desirably thin, preferably between about one and about thirty microns in thickness. The procedure for preparation of a two-layer structure in which the polyimide is used, for example, as a passivation coating, includes diluting the polymer solution to the proper viscosity and solids level to obtain the desired coating thickness, filtering, substrate cleaning, applying the adhesion promoter, spin-coating the polymer solution on the surface, and thermal curing.

Dilution of the polyamic acid solution is based on the thickness requirement of the final coating, the viscosity and solids content of the solution, and the spin curve data for the polymer. The spin curve is obtained by spin-coating the polymer onto the substrate at various spin speeds, measuring the resulting thickness and plotting thickness versus spin speed. Clean, dry, high-purity solvent should be used as the diluent. The diluted solution should be pressure filtered before further processing.

The polyamic acid solution is statically applied to a nonrotating substrate and spread across the surface by spinning. The substrate is then spun at the spin speed determined from the spin curve for the final coating thickness required. The polyamic acid solution is thermally cured in a predetermined stepped-temperature cycle under inert gas flow.

The procedure for preparation of a three-layer structure in which the instant polyimides are used, for example as an interlayer dielectric insulating material, includes diluting the polymer solution to the proper viscosity and solids level to obtain the desired coating thickness, filtering, substrate cleaning, applying the adhesion promoter, spin-coating the polymer solution on a surface, thermal curing, applying the top layer of metal or inorganic material, photolithographic patterning of the top layer, and wet or dry etching of the top layer.

Dilution of the polyamic acid solution is based on the thickness requirement of the final coating, the viscosity and solids content of the solution, and the spin curve data for the polymer. The spin curve is obtained by spin-coating the polymer onto the substrate at various spin speeds, thermal curing, measuring the resulting thickness, and plotting thickness versus spin speed. Clean, dry, high-purity solvent should be used as the diluent. The diluted solution should be pressure filtered before further processing. The polyamic acid solution is statically applied to a nonrotating substrate as described above and the polyamic acid solution is thermally cured. Final cure temperatures range from about 250° C. to about 400° C.

The cured polyimide surface may be reactive ion etched in a plasma before the application of the top layer of metal or other material to enhance the adhesion between the polymer and the top layer.

The top layer material can be patterned after application using photolithography. This includes spin-coating and baking a photoresist onto the surface, exposing the mask pattern onto the photoresist, developing the photoresist, wet or dry etching the top layer material, and removing the remaining photoresist from the final pattern.

Uses of the polyimides and copolyimides include interlayer dielectrics on silicon and gallium arsenide integrated circuits fabricated with multilevel metal schemes and on multilayer thin-film, high-performance packages; dielectrics in flat panel displays; passivating coatings, thermal-mechanical buffer and alpha-particle protection coatings on I.C.s and other circuitry; masks for multi-layer resist processes; negative profile liftoff processes; harsh processes, such as ion implantation or dry etching; and high aspect-ratio masking processes such as plating.

The following Examples will serve to illustrate certain embodiments of the herein disclosed invention. These Examples should not, however, be construed as limiting the scope of the novel invention as there are many variations which may be made thereon without departing from the spirit of the disclosed invention, as those of skill in the art will recognize.

EXAMPLES

General

All percents used are weight percents. Test procedures used to characterize the polyimides of this invention are as follows.

Dielectric Constant

Dielectric constant measurements were made on thin films (0.7 to 2.0 mils thick) cast from polyamic acid solutions onto glass plates and thermally cured. The measurements were made using a two-fluid cell technique as described in ASTM D 150. The reproducibility of the dielectric constant measurement using this technique is about ±2%.

Films were dried and stored in a nitrogen-purged dry box prior to testing at 1 MHz to give results at 0% relative humidity.

Moisture Absorption and Change in Dielectric Constant at 40% R.H.

Moisture absorption measurements were made on waferlevel capacitor structures. Three-layer structures of aluminum/polyimide/aluminum were fabricated on silicon wafers according to the processing procedure for ms three-layer structures set out above. Aluminum thickness was 0.6 microns, polymer thickness was 1 to 2 microns, and capacitor size was 0.01 square centimeters. Capacitance of the structures was measured between 50° C. and 300° C. over a range of frequencies. The capacitors were tested to 300° C., allowed to cool, and immediately reheated to 300° C. The moisture absorption values were calculated based on the difference between the measured 1 MHz dielectric constants at 50° C. for the first and second heats of the test according to the formula:

$$\text{Equilibrium Moisture (100\% R.H.)} \approx \frac{2\Delta\epsilon}{0.4}$$

which formula is based upon 2% equilibrium moisture per unit change in epsilon, and where $\Delta\epsilon$ is the change in dielectric constant between first and second heat. The start of the first heat is assumed to be at 40% R.H. as the wafers were allowed to equilibrate for two days at 40% R.H. prior to testing. The start of the second heat is assumed to be approximately 0% R.H. as the wafers were reheated immediately after the water was driven off during the first heat. The change in dielectric constant at 40% R.H. is the percent difference between the measured 1 MHz dielectric constants at 50° C. for the first and second heats of the test.

Glass Transition Temperature (Tg)

The glass transition temperature of the polymers was measured by differential scanning calorimetry. Tg measurements were made on thin films cast from polyamic acid solutions onto glass plates and thermally cured.

Temperature of Onset of Degradation in Air and Nitrogen

The temperature of onset of degradation of the polymer was measured by thermogravimetric analysis. The onset temperature is the temperature at which 1 weight percent weight loss is found at a heating rate of 10° C./min. Measurements were made on thin films cast from polyamic acid solutions onto glass plates and thermally cured.

EXAMPLE 1

Into a 100 ml resin kettle were added 1.749 g of diphenol, 4.247 g of 2-chloro-5-nitrobenzotrifluoride, 3,373 g of potassium carbonate, and 50 g of N,N-dimethylformamide. This mixture was heated and stirred under a nitrogen atmosphere at 140° C. for 3 hr and poured into an excess of water to precipitate the dinitro precursor to FAPB. The precipitate was filtered, washed with additional water, and air-dried.

To 600 ml of ethanol was added a 54.7 g amount of dinitro intermediate made above and 10 g of 1 wt. % palladium on carbon. This mixture was placed under 400 psig of hydrogen pressure and heated to about 95° C. with vigorous stirring. After 45 min the pressure was released and the reaction mixture cooled. The catalyst was filtered from the reaction mixture, and the ethanol was removed to leave 48.4 g of crude product. The crude product was purified by dissolving it in hot toluene, treating with activated carbon, filtering, and crystallizing to give 16.3 g of purified FAPB. NMR spectra confirm the identity of the product as 4,4'-bis(4-amino-2-trifluoromethylphenoxy)biphenyl.

EXAMPLE 2

Into a reaction flask was weighed a 2.131 g amount of FAPB made as in Example 1, 1.876 g of 6FDA, and 22.7 g N-methylpyrrolidone. After mixing overnight, a portion of the polymer solution was diluted to 0.5 g per dL and the IV measured to be 1.05 dL/g.

EXAMPLE 3

The reagents 6FDA (11.27 g, 25.37 mmol) and 4,4'-[1,4-phenylene-bis(1-methylethylidene)]bisaniline (BAP) (8.727 g, 25.33 mmol) were added to a 250 ml resin kettle under nitrogen. An 80 g amount of N-methylpyrrolidone was added, and the solution was mixed by an overhead stirrer. This produced a solution of polyamic acid that was 20% solids by weight with an IV of 1.43 dL/g.

Samples of the polyamic acid were cast on glass plates to a thickness of about eight microns. The films were cured by placing them in a gas oven under an inert gas atmosphere for 55 min at room temperature, and then heating them for 1 hr each at 80° C., 200° C., and 300° C. This produced light yellow films of excellent quality.

EXAMPLE 4

To a clean and dry 100 ml reaction kettle were added 5.402 g of 3,5-diamino-t-butylbenzene (DATB) and 14.611 g of 2,2-bis(3,4-dicarboxyphenyl)hexafluoropropane dianhydride (6FDA); all operations were performed under a nitrogen atmosphere. To the monomers was added a 59.99 g amount of N-methylpyrrolidone (NMP) and the resulting mixture was stirred for 17 hr. The resulting polyamic acid solution contained 25% by weight solids and had an IV of 1.06 dL/g at 25° C. The solution was refrigerated until needed.

A film of the 6FDA/DATB polyamic acid was prepared by casting the resin onto a soda-lime glass in a dust-free environment. The polyamic acid film was thermally imidized to the corresponding polyimide film by heating in a forced-air oven for 1 hr at 80° C., then at 200° C., and finally at 300° C. The resulting film was removed from the glass plate after cooling to room temperature by soaking in water. The dielectric constant of the dried polyimide film was 2.77 (0% R.H.) at 1 MHz.

EXAMPLE 5

In a manner similar to that described in Example 4, 6.742 g of 2,2-bis(4-aminophenyl)propane (BAA) and 13.239 g of 6FDA were reacted in 60.02 g of NMP. The resulting polyamic acid solution contained 25% solids and had an IV of 0.84 dL/g at 25° C. A film cast from the polyamic acid solution was thermally imidized by the procedure described in Example 4 and had a dielectric constant of 2.88 at 1 MHz and 0% R.H.

EXAMPLE 6

A copolymer of 6FDA with a mixture of diamines was prepared in the following manner. A mixture of 2.028 g of DATB and 1.135 g of 4,4'-bis(p-aminophenoxy)biphenyl (APBP) was dissolved in 15.057 g of NMP and reserved. In a separate kettle, 6.842 g of 6FDA was dissolved in 34.869 g of NMP. The mixed diamines solution was added over a period of 30 min to the 6FDA solution with stirring. An additional 6.748g of NMP were added to the solution. All manipulations were performed under a nitrogen atmosphere. The resulting polyamic acid solution was 15% solids and showed an IV of 0.92 dL/g at 25° C.

EXAMPLE 7

A copolymer of 6FDA, IPAN and APBP can be made in a manner similar to Example 6. The 4,4'-bis(p-aminophenoxy)biphenyl (APBP) can be dissolved in NMP and a mixture of 6FDA and IPAN dissolved in NMP in a separate container, the total number of mols of dianhydride equal to the mols of diamine. The dianhydride solution is added slowly to the diamine solution. This will produce a random copolymer of APBP with 6FDA and IPAN. The dielectric constant of this polymer is expected to be below about 3.0.

EXAMPLE 8

Some physical properties of the polyimide and copolyimides made as in the above Examples are given in the Table below.

TABLE

Physical Properties of Films and Wafer-Level Coatings of Some Polyimides

| Polyimide | Dielectric Constant at 0% R.H. and 1MHz[2] | Moisture Absorption (wafer Level) (%) | % Increase in Dielectric Constant at 40% R.H. (wafer Level) |
|---|---|---|---|
| 6FDA/DATB (Ex. 4) | 2.77 (2.62)[4] | 1.0 | 7.5 |
| 6FDA/BAA (Ex. 5) | 2.88 (2.72)[4] | 0.5 | 3.4 |
| 6FDA/APBP | 2.86 (2.90)[4] | 1.0 | 7.0 |
| 6FDA/DABF | 2.74 (2.60)[4] | 0.6 | 4.3 |
| IPAN/DABF | 2.95 | 0.8[1] | — |
| 6FDA/DATB/APBP[3] | 2.97 (2.83)[4] | 0.8 | 5.6 |
| 6FDA/OBA/DATB | 2.87 (2.87)[4] | 0.9 | 6.4 |
| IPAN/FAPB | 2.98 | 0.17[1] | — |
| 6FDA/FAPB | 2.85 | 0.15[1] | — |
| 6FDA/BAP | 2.77 | 0.45 | — |
| IPAN/APBP | 3.04 | — | — |
| IPAN/BAA | 2.90 | 1.1 | 7.0 |
| IPAN/BAAF | 2.83 | — | — |
| 6FDA/BAPP | 2.95 | — | — |
| IPAN/BAPP | 2.85 (2.79)[4] | 1.0 | 7.2 |

| Polyimide | Onset of Degradation Tg (°C.) | Temperature of Onset of Degradation in N$_2$(°C.) | Temperature of Degradation in Air (°C.) |
|---|---|---|---|
| 6FDA/DATB (Ex. 4) | 310 | 470 | 473 |
| 6FDA/BAA (Ex. 5) | 304 | 482 | 446 |
| 6FDA/APBP | 282 | 485 | 459 |
| 6FDA/DABF | 300 | 503 | 474 |
| IPAN/DABF | 292 | 492 | 458 |
| 6FDA/DATB/APBP[3] | 349 | 458 | 394 |
| 6FDA/OBA/DATB | 296 | 467 | 404 |
| IPAN/FAPB | 264 | 506 | 468 |
| 6FDA/FAPB | 271 | 497 | 496 |

TABLE-continued

| | | | |
|---|---|---|---|
| 6FDA/BAP | 276 | 474 | 440 |
| IPAN/APBP | 273 | 512 | 464 |
| IPAN/BAA | 285 | 474 | 421 |
| IPAN/BAAF | 308 | 517 | 480 |
| 6FDA/BAPP | 254 | 497 | 450 |
| IPAN/BAPP | 240 | 488 | 440 |

[1] data from film moisture absorption test rather than wafer-level dielectric results
[2] film measurement
[3] post-cured at 350° C.
[4] wafer-level measurement

What is claimed is:

1. A process for making an interlevel dielectric structure comprising:
   (a) polymerizing a dianhydride selected from the group consisting of 2,2-bis(3,4-dicarboxyphenyl)-propane dianhydride, 2,2-bis(3,4-dicarboxyphenyl)hexafluoropropane dianhydride, and their respective acids and esters, and an aromatic diamine selected from the group consisting of 2,2-bis(4-aminophenyl)propane and 4,4'-bis(p-aminophenoxy)biphenyl in the presence of a solvent to make a solution containing a polyamic acid,
   (b) coating the solution of polyamic acid on a substrate,
   (c) evaporating the solvent to provide a polyamic acid coated substrate,
   (d) curing the polyamic acid to convert the polyamic acid to a polyimide and provide a polyimide layer, and
   (e) overlaying the polyimide layer with an adhering layer of a metal or an inorganic material.

2. The process of claim 1 wherein the substrate is selected from the group consisting of silicon, silicon dioxide, silicon nitride, silicon oxynitride, aluminum nitride, gallium arsenide, aluminum oxide, beryllium oxide, and tantalum nitride.

3. The process of claim 1 wherein the substrate is silicon, silicon dioxide, or gallium arsenide.

4. The process of claim 1 having at least one multilevel scheme comprising sequential layers of aluminum, polyimide or copolyimide, and aluminum.

5. The process of claim 1 wherein the substrate is aluminum.

6. The process of claim 1 wherein the adhering layer of a metal is aluminum.

7. The process of claim 1 wherein said polyimide or copolyimide is made from 2,2-bis(3,4-dicarboxyphenyl)-hexafluoropropane dianhydride and a diamine selected from the group consisting of 4,4'-bis(p-aminophenoxy)-biphenyl and 2,2-bis(4-amino-phenyl)propane.

8. The process of claim 7 wherein said spreading is done by spin-coating.

9. A process for making an interlevel dielectric structure comprising:
   (a) polymerizing a dianhydride selected from the group consisting of 2,2-bis(3,4-dicarboxyphenyl)-propane dianhydride, 2,2-bis(3,4-dicarboxyphenyl) hexafluoropropane dianhydride, and their respective acids and esters, and 2,2-bis{4-(p-aminophenoxy)phenyl} propane in the presence of a solvent to make a solution containing a polyamic acid,
   (b) coating the solution of polyamic acid on a substrate,
   (c) evaporating the solvent to provide a polyamic acid coated substrate,
   (d) curing the polyamic acid to convert the polyamic acid to a polyimide and provide a polyimide layer, and
   (e) overlaying the polyimide layer with an adhering layer of a metal or an inorganic material.

10. The process of claim 9 wherein the substrate is selected from the group consisting of silicon, silicon dioxide, silicon nitride, silicon oxynitride, aluminum nitride, gallium arsenide, aluminum oxide, beryllium oxide, and tantalum nitride.

11. The process of claim 9 wherein the substrate is silicon, silicon dioxide, or gallium arsenide.

12. The process of claim 9 having at least one multilevel scheme comprising sequential layers of aluminum, polyimide or copolyimide, and aluminum.

13. The process of claim 9 wherein the substrate is aluminum.

14. The process of claim 9 wherein the adhering layer of a metal is aluminum.

* * * * *

UNITED STATES PATENT AND TRADEMARK OFFICE
CERTIFICATE OF CORRECTION

PATENT NO. : 5,268,193
DATED : Dec. 7, 1993
INVENTOR(S) : Allyson J. Beuhler, et al It is certified that error appears in the above-indentified patent and that said Letters Patent is hereby corrected as shown below:

| Col. | Line | |
|---|---|---|
| 4 | 8 | "2,2-bis[1,4-(p-aminophenoxy)phenyl]propane," should read --2,2-bis[4-(p-aminophenoxy)phenyl]propane,-- |
| 8 | 14 | "for ms three-layer structures" should read --for three-layer structures-- |
| 10 | 56 | within the "Table" that follows "Example 8" the column entitled "Onset of Degradation Tg (°C.)" and the column entitled "Temperature of in Air(°C.)" should read as follows: --Tg (°C.)-- and --Temperature of Onset of Degradation in Air (°C.)-- |

Signed and Sealed this

Fourteenth Day of June, 1994

Attest:

BRUCE LEHMAN

*Attesting Officer*     *Commissioner of Patents and Trademarks*